US011832459B2

(12) United States Patent
Gudilin et al.

(10) Patent No.: US 11,832,459 B2
(45) Date of Patent: Nov. 28, 2023

(54) METHOD FOR PRODUCING A LIGHT ABSORBING FILM WITH A PEROVSKITE-LIKE STRUCTURE

(71) Applicant: JOINT STOCK COMPANY KRASNOYARSK HYDROPOWER PLANT, Divnogorsk (RU)

(72) Inventors: Evgenij Alekseevich Gudilin, Moscow (RU); Aleksej Borisovich Tarasov, Moscow (RU); Andrej Andreevich Petrov, Sankt-Peterburg (RU); Nikolaj Andreevich Belich, Borovsk (RU); Aleksej Yur'evich Grishko, Volgograd (RU)

(73) Assignee: JOINT STOCK COMPANY KRASNOYARSK HYDROPOWER PLANT, Krasnoyarsk Region (RU)

( * ) Notice: Subject to any disclaimer, the term of this patent is extended or adjusted under 35 U.S.C. 154(b) by 0 days.

(21) Appl. No.: 16/955,843

(22) PCT Filed: Dec. 18, 2018

(86) PCT No.: PCT/RU2018/000834
§ 371 (c)(1),
(2) Date: Jun. 19, 2020

(87) PCT Pub. No.: WO2019/132723
PCT Pub. Date: Jul. 4, 2019

(65) Prior Publication Data
US 2020/0343466 A1    Oct. 29, 2020

(30) Foreign Application Priority Data

Dec. 25, 2017 (RU) .......................... RU2017145657

(51) Int. Cl.
*H01G 9/20* (2006.01)
*H10K 30/10* (2023.01)
*C23C 30/00* (2006.01)
*H10K 71/16* (2023.01)

(52) U.S. Cl.
CPC ............. *H10K 30/10* (2023.02); *C23C 30/00* (2013.01); *H10K 71/164* (2023.02)

(58) Field of Classification Search
CPC ............... H01L 51/4213; H01L 51/001; H01L 51/4226; H01L 51/0028; H01L 51/0007; C23C 30/00; C23C 4/04; C23C 14/06; C23C 26/02; C23C 22/02; Y02E 10/549; Y02P 70/50; H01G 9/2059
See application file for complete search history.

(56) References Cited

U.S. PATENT DOCUMENTS

| | | | | |
|---|---|---|---|---|
| 9,391,287 | B1 * | 7/2016 | Huang | H01L 51/4213 |
| 10,128,052 | B1 * | 11/2018 | Zang | H01G 9/0036 |
| 10,535,828 | B2 * | 1/2020 | Saliba | H01L 51/0032 |
| 10,910,569 | B2 * | 2/2021 | Zhu | H01L 51/0026 |
| 11,081,292 | B2 * | 8/2021 | Tarasov | H01L 51/0029 |
| 2015/0295194 | A1 * | 10/2015 | Kanatzidis | H01L 51/0032 136/263 |
| 2015/0340632 | A1 * | 11/2015 | Etgar | H01L 51/0032 136/255 |
| 2017/0084399 | A1 * | 3/2017 | Vak | H01L 51/0036 |
| 2017/0243699 | A1 * | 8/2017 | Beaumont | H01G 9/2009 |
| 2017/0365416 | A1 * | 12/2017 | Padture | H01L 51/0003 |
| 2018/0005764 | A1 * | 1/2018 | Jones | C23C 18/1689 |
| 2018/0166504 | A1 * | 6/2018 | Kamino | H01L 51/442 |
| 2018/0277309 | A1 * | 9/2018 | Etgar | H01G 9/2045 |
| 2018/0351123 | A1 * | 12/2018 | Saliba | H01L 51/0032 |
| 2019/0185495 | A1 * | 6/2019 | Cahen | H01L 51/005 |
| 2019/0312155 | A1 * | 10/2019 | Saliba | H01L 31/022425 |
| 2019/0345177 | A1 * | 11/2019 | Gudilin | H01L 51/0077 |
| 2021/0188884 | A1 * | 6/2021 | Etgar | H01L 51/422 |
| 2021/0320253 | A1 * | 10/2021 | Gudilin | H01L 51/0007 |

FOREIGN PATENT DOCUMENTS

| WO | 2016/131376 A1 | 8/2016 |
|---|---|---|
| WO | 2017/195191 A1 | 11/2017 |

\* cited by examiner

*Primary Examiner* — Bitew A Dinke
(74) *Attorney, Agent, or Firm* — Nixon & Vanderhye, P.C.

(57) ABSTRACT

The invention relates to methods for producing a light-absorbing material with a perovskite-like structure, and can be used to form a light-absorbing layer in the production of photovoltaic cells for saving the materials and increasing the allowable size of converters. These advantages are achieved by forming a uniform layer of component B on the substrate, preparing a mixture of reagents that react with component B under predetermined conditions, and a reaction inhibitor that suppresses this reaction under these conditions; the prepared mixture is applied in stoichiometric amount or greater than stoichiometric on the layer of component B and the reaction inhibitor is removed from the mixture, ensuring activation of the chemical reaction between the mixture of reagents and component B to form films of perovskite-like material.

20 Claims, No Drawings

METHOD FOR PRODUCING A LIGHT ABSORBING FILM WITH A PEROVSKITE-LIKE STRUCTURE

This application is the U.S. national phase of International Application No. PCT/RU/2018/000834 filed on Dec. 18, 2018, which claims priority to Russian Application No. RU 2017145657 filed on Dec. 25, 2017, the entire contents of each of which is hereby incorporated herein by reference.

TECHNICAL FIELD

The invention relates to methods for producing a light-absorbing material with a perovskite-like structure, and may be used to form a light-absorbing layer in the production of photoelectric converters.

BACKGROUND

From the prior art there are known various methods for producing light-absorbing materials with a perovskite-like structure.

The paper [J. Burschka et al. Sequential deposition of high-performance perovskite-sensitized solar cells//Nature.—2013.—T. 499.—No. 7458.—P. 316.] describes the formation of a thin layer of perovskite $CH_3NH_3PbI_3$ in two stages by applying a $PbI_2$ layer of necessary thickness on a substrate by applying a $PbI_2$ solution on the substrate and its rotation at high speed around the axis perpendicular to its plane (rotating substrate method, spin-coating), followed by immersing the obtained thin layer of $PbI_2$ in a solution of MAI in isopropanol.

The paper [Saliba M. et al. Incorporation of rubidium cations into perovskite solar cells improves photovoltaic performance//Science (80-.). 2016. Vol. 354, No 6309. P. 206-209.] describes the formation of a thin perovskite $CH_3NH_3PbI_3$ layer of necessary thickness in one stage by applying a perovskite solution on a substrate and its rotation at high speed around the axis perpendicular to its plane (rotating substrate method, spin-coating).

The disadvantage of the above methods is the difficulty of producing a layer of the source component ($PbI_2$) or perovskite from a solution on a large area substrate and, accordingly, the impossibility of obtaining large area perovskite solar cells.

Known patent CN104250723, 9 Aug. 2014, Zhi Zheng, Cheng Camry, Lei Yan, Jia Huimin, Ho Wei Wei, He Yingying "Chemical method for in-situ large-area controlled synthesis of perovskite type $CH_3NH_3PbI_3$ membrane material based on lead simple-substance membrane" describes a method for producing perovskite $CH_3NH_3PbI_3$ as a result of immersion of metallic lead films, which are easily applied evenly with controlled thickness over large areas, into a solution of iodine and methyl ammonium iodide in an organic solvent, for example, ethanol. Metallic lead in the form of an even layer is sprayed onto the nonporous surface of the electron-conducting layer by magnetron sputtering, and then is brought into reaction with an organic solvent containing molecular iodine and methyl ammonium iodide. As a result, a continuous nonporous layer of lead turns into a continuous nonporous perovskite layer.

In the patent CN105369232, 16 Feb. 2015, Zhi Zheng, He Yingying, Lei Yan, Cheng Camry, Jia Huimin, Ho Wei Wei, "Lead-based perovskite-type composite elemental thin-film in-situ wide area control $CH_3NH_3PbBr_3$ film material chemical method" the method for producing perovskite $CH_3NH_3PbBr_3$ is described based on immersing metallic lead films that are easily applied evenly with a controlled thickness over large areas into a solution of methyl ammonium bromide in an organic solvent, for example, isopropanol.

The disadvantage of the above methods is poor control of the morphology of the produced perovskite layer, as well as the need to immerse the substrates in the reagent solution, which complicates and slows down the technological process of forming organic-inorganic perovskite, makes more difficult the production of large-area films and leads to production, health and environmental risks.

The paper of Mater. Horiz., 2017, 4, 625-632, Petrov Andrey A., Belich Nikolai A., Grishko Aleksei Y., Stepanov Nikita M., Dorofeev Sergey G., Maksimov Eugene G., Shevelkov Andrei V., Zakeeruddin Shaik M., Michael Graetzel, Tarasov Alexey B., Goodilin Eugene A., "A new formation strategy of hybrid perovskites via room temperature reactive polyiodide melts" describes a solvent-free method for forming perovskite layer as a result of the reaction of a metal lead layer and a reagent applied to it with the general composition $MAI_{3+x}$.

A disadvantage of the known method is the difficulty of achieving uniform distribution of a viscous highly concentrated polyiodide (polyhalide) reagent over a large substrate area, as well as the lack of control and the impossibility of applying this melt in a stoichiometric amount with respect to component B, which, in particular, can lead to incomplete conversion of the component B in perovskite or the formation of phases containing a surplus of the components of the original melt. Thus, as a result, the quality (in particular, the uniformity of thickness and phase composition) of the resulting film decreases, which negatively affects the efficiency of the final product based on the films obtained, for example, the solar cell.

In the patent CN104051629A, 2014/09/17 "Preparation method for perovskite type solar cell based on spraying technology" a technological method for the production of perovskite solar cells and, in particular, the light absorbing perovskite composition of $ABX_3$ composition is described by one or two-stage spraying of solutions of components AB and $BX_2$ in organic solvents. The disadvantage of this method is the complexity of controlling the thickness, homogeneity and morphology of the perovskite layer, obtained by this method due to a substantially non-equilibrium crystallization process, control of which cannot be carried out over large areas. In addition, this method implies spraying a solution, containing component B, which is associated with production, health, and environmental risks.

Common disadvantages of the above methods are the fundamental technological limitations of the ability to form a thin perovskite layer with the required properties (thickness, morphology, optical and electrical properties) on large area substrates which limits the maximum possible sizes of individual perovskite solar cells and, accordingly, limits the possibilities for reducing unit costs for the production of modules (batteries) of rated capacity.

SUMMARY OF THE INVENTION

The perovskite-like structure, in terms of the application, should be understood as both the crystal structure of the perovskite mineral and the crystal structures that have certain structural deviations (distorted perovskite structure), for example, with a lower lattice symmetry (for example, tetragonal syngony) or crystal structures containing perovskite layers alternating with any other layers (for example, the phases of Aurivillius, Ruddlesden-Popper phases, Dion- Jacobson phases). Perovskite-like compounds is a notion of compounds with a perovskite-like structure.

The technical problem solved by the claimed invention is the creation of a technologically advanced method for producing homogeneous films of light-absorbing materials with a perovskite-like structure having the composition of $ABX_3$ ($A=CH_3NH_3^+$ or $(NH_2)_2CH^+$ or $C(NH_2)_3^+$ or $Cs^+$ or $Rb^+$ or a mixture of them; $B=B=Sn^{2+}$ or $Pb^{2+}$, or a mixture of them, including addition of Bi and Cu additives; $X=Cl^-$ or $Br^-$ or $I^-$ or a mixture of them) on large-area substrates by a technological method without using solutions containing component B.

The technical result achieved with the use of the invention is the possibility of forming a perovskite layer with desired microstructure and functional properties on surfaces of any size.

Additional technical result achieved when using the claimed invention is to provide the possibility of obtaining a single-phase film without breaks (or pinholes) with a high degree of uniformity, which will allow to use the obtained material in a solar cells of large area. The method is also characterized by manufacturability, simplicity and speed of implementation, which makes it more accessible for use in industrial production. Another additional technical result achieved with the implementation of the invention is the possibility of dosed application of precursors, which eliminates significant losses of reagents during the synthesis and reduces the cost of production. An additional realizable technical result is also the possibility of using the invention in implementing technologically relevant approaches for obtaining perovskite films on substrates of complex shape and, in particular, on flexible substrates.

Additional technical result achieved when using the claimed invention, is the ability to dispense and control the reactivity of the reagent to control the process of forming a semiconductor material.

DETAILED DESCRIPTION OF THE INVENTION

The reaction mixture, in the application, refers to one or more reagents that react with component B, as well as a mixture of them with a reaction inhibitor.

The inhibitor, in the application, in general, refers to a chemical compound or a mixture of several compounds, where adding the inhibitor to the reaction mixture suppresses the chemical reaction between two or more reagents. In the particular case, the solvent may act as an inhibitor, reducing the chemical activity of one or more reagents. In the particular case, the inhibitor inhibits a chemical reaction between some component of the reaction mixture and component B.

The technical result is achieved by forming a uniform layer of component B on the substrate, preparing a mixture of reagents that react with component B under predetermined conditions, and a reaction inhibitor that suppresses this reaction under these conditions, applying the mixture in the stoichiometric amount or more than stoichiometric amount on the layer of component B and removing the reaction inhibitor from the mixture to activate the chemical reaction between the reaction mixture and component B to form a perovskite-like material. That is, upon receiving a film of light-absorbing material with a perovskite-like structure, a uniform layer of component B is formed on the substrate, a mixture is prepared from reactants that react with component B under predetermined conditions, and a reaction inhibitor that suppresses this reaction under these conditions, the prepared mixture is applied in stoichiometric amount or more than stoichiometric amount on the layer of component B and the reaction inhibitor is removed from the mixture, while ensuring activation of the chemical reaction between the mixture of the reagents and component B to form a perovskite-like film material.

In particular cases, the implementation of the invention, the reaction inhibitor is removed from the reaction mixture by evaporation from the reaction mixture or freezing the specified reagents from the mixture or sublimation of the reaction inhibitor.

In the particular case of the invention, a solvent is used as an inhibitor of the reaction, which can dissolve at least one of the reagents in or a liquid that cannot be mixed with at least one of the reagents is used as an inhibitor of the reaction.

In the particular case of the invention, the reaction inhibitor is removed by washing the carrier substrate with a solvent in which the components of the final functional layer (film of perovskite-like material) are insoluble.

In the particular case of the invention, upon producing a layer (or film) of a light-absorbing material with a perovskite-like structure having the structural formula $ABX_3$, according to the technical solution, a layer of reagent B is applied to the substrate, which is a film of elementary Pb or Sn or a mixture of them, and then a solution of the mixture of reagents AX and $X_2$ in an organic solvent is applied on the substrate, wherein an organic solvent slows down the reaction between AX and $X_2$ with reagent B, conditions for the removal of the solvent are provided that step ensure proper conditions for proceeding the reaction $B+AX+X_2=ABX_3$. In this case, $CH_3NH_3^+$ or $(NH_2)_2CH^+$ or $C(NH_2)_3^+$ or $Cs^+$ or $Rb^+$ or a mixture of them is used as component A; $Cl^-$ or $Br^-$ or $I^-$ or a mixture of them is used as component X.

In the particular implementation of the invention, an organic solvent is used as the inhibitor in which the reagents AX and $X_2$ are dissolved, but component B is not dissolved in the organic solvent. Component B is applied per unit area in an amount that provides a given thickness of the final film of the perovskite-like compound $ABX_3$. Component B can be applied by vacuum deposition, electrochemical deposition, contact of a molten metal with a cooled substrate, by chemical deposition from the gas phase or by other methods. A solution of the mixture of reagents AX and $X_2$ is applied by spraying, or printing or dripping. Surplus reagents AX and $X_2$ upon completion of the reaction, if necessary, can be removed by washing in a solvent that does not interact with the perovskite layer, dripping the solvent onto the surface, calcinating at elevated temperature, evaporating under reduced pressure. Gases such as, for example, dry air, argon and nitrogen can act as a carrier gas during spraying. Solvents such as isopropyl alcohol, ethyl alcohol and other organic solvents can be used as solvents for the AX and $X_2$ reagents, as well as for washing the substrates after the completion of the reaction.

In the particular case of the implementation of the invention, the application of the reaction mixture is carried out under conditions in which a surplus of components of the reaction is removed in a natural way (the "autodosing" of the components of the reaction mixture occurs) due to their evaporation or sublimation during application.

With the invention, it is possible to control the stoichiometry of the formation of a film of light-absorbing material reaction due to preliminary controlled deposition of component B on the substrate and further controlled deposition of the AX and $X_2$ reagents solution, carried out by inkjet, spraying or other methods, ensuring uniform application of the mixture on the substrate. After applying the solution of reagents AX and $X_2$ on the surface of the film of component B, the solvent removal takes place followed by the formation of liquid polyhalide reaction melts consisting of a mixture of reagents AX and $X_2$ of the general composition structure $AX_n$ (n≥2.5), which are uniformly distributed over the surface of the film of component B and react with this component with the formation of a perovskite-like compound with an $ABX_3$ structure, which makes it possible to achieve a high homogeneity of films over a large area by methods that are scalable and realizable under industrial production conditions.

Component B is considered to be metals, a mixture of them, alloys, as well as compounds where in the elemental composition presents corresponding metal.

The uniform distribution of the reaction melt over the surface of the component B is achieved by the so-called "Reactive wetting" of the film surface of component B with polyhalide melts of composition $AX_n$, the mechanism of which is to change the nature of wetting as a result of the reaction on the surface of component B due to their high reactivity with respect to component B.

With the proposed method, the achievement of a technical result, namely, obtaining a single-phase, highly homogeneous large area film of a light absorbing material, is achieved by uniformly distributing $AX_n$ (n≥2.5) reaction melts over the surface of the B component film, as well as controlling the stoichiometry of the reaction to form a film of light absorbing material. The main parameters affecting the achievement of the technical result are the thickness and uniformity of the B film applied to the substrate, the uniform distribution of the AX and $X_2$ mixture solution over the surface of the B film, the concentration of the AX and $X_2$ reagents, the amount of the B component applied to the film, the composition of the solvent used, the temperature of the film of the component B, the presence of modifying additives in the solution of reagents AX and $X_2$ and/or in the film of component B.

The proposed method allows to obtain continuous single-phase films of compounds with a perovskite structure of a wide range of compositions ($ABX_3$, where $CH_3NH_3^+$ ($MA^+$), $(NH_2)_2CH^+$ ($FA^+$), $Cs^+$, $Rb^+$, or a mixture of them are usually used as $A^+$, $B^{2+}$—Pb2+, Sn2+ or a mixture of them; as $X^-$ are used $I^-$, $Br^-$, $Cl^-$ or a mixture of them) which can be used to create solar cells, large-area solar cells, photodetectors, LEDs and other semiconductor devices.

In addition, using the proposed method it is possible to obtain thin films of semiconductors, including those ones based on the usage of materials with a structure different from perovskite-like and made from elements or their sources other than Pb, Sn.

In an illustrative implementation, to obtain a hybrid organo-inorganic perovskite composition $CH_3NH_3PbI_3$ ($MAPbI_3$), a solution of iodine ($I_2$) and methyl ammonium iodide (MAI) in isopropanol (i-PrOH) was sprayed onto a substrate heated to 120° C. and pre-coated with a layer of metallic lead (Pb) on it. Upon contact of the sprayed aerosol with a heated lead film, isopropanol evaporated to form a polyiodide composition on the surface of lead and MAI-nI2 (n≥1), which reacted with lead, as a result was achieved the formation of a film of $CH_3NH_3PbI_3$. The reaction takes place with a time delays, where the solvent removal stage determines the time delay and is crucial because when the metal lead film is immersed in the solution used for spraying (in a certain concentration range), the conversion of metal lead into perovskite is retarded. The formation of perovskite in the proposed method occurs in the process of drying the droplets deposited on the surface of metallic lead, as a result of which a polyiodide composition is formed, which reacts with lead. Since the reaction starts before the complete evaporation of isopropanol, and the reaction rate is determined, including the concentration of isopropanol in the composition, it is possible to control the rate of the reaction, for example, by changing the substrate temperature or the content of isopropanol in the original composition. Below are the parameters of the synthesis, which may be used in the preparation of continuous single-phase films by the proposed method with the achievement of the technical result, as well as the effect of influence of features on the parameters of the synthesis.

The composition of the used halides that make up the solution, directly affects the morphology and composition of the perovskite obtained. Any combination of AX is possible. The following combinations were tested when implementing the method: MAI, MAI/MABr, which resulted in the use of $MAPbI_3$, $MAPbI_xBr_{3-x}$; MAI/FAI, the use of which was obtained $MA_xFA_{1-x}PbI_3$.

The total ratio of the content of halides in a solution to the content of $I_2$, or the ratio $AX-I_2$ in reactions with metals, produces a direct impact on the morphology, phase composition and other properties of the final product. Since iodine and various halides sublimate (evaporate) during sputtering and subsequent annealing at different rates, the final composition of the melt on the surface of the substrate will be determined not only by the composition of the applied solution, but also by temperature and pressure of the process. Using the example of obtaining $MAPbI_3$, the following relationships were tested: $MAI:I_1$=1:1 and $MAI:I_1$=1:1.5. Primary results showed that in the designated range it is possible to obtain single-phase $MAPbI_3$ films, while films obtained using the 1:1.5 solution demonstrate the best functional properties, due to the fact that some of the iodine evaporates from heating and, if for the reaction requires $MAI:I_2$=1:1, and for the implementation of the method the composition is used, where $MAI:I_1$=1:1, then the actual content of iodine participating in the reaction is less, that is, there exists a lack of iodine in the system.

To improve the functional properties and stability of the final films, it is possible to introduce into the initial solution other halides that do not form the target perovskite structure, for example, aminovaleric acid hydroiodide, butylammonium iodide (in general, $CH_3$—$(CH_2)_n$—$NH_3I$), phenylethylammonium iodide, $BiI_3$ and others. HI, $CH_3NH_3Cl$ and $(NH_2)_2CHCl$ can also be used as modifying additives.

When implementing the method it is possible to use different concentrations of reagents. The method showed good results in terms of improving the homogeneity and quality of perovskite films in the range of total concentrations of iodides from 2 to 10 mg/ml.

An important factor determining the functional properties of films of semiconductor materials obtained by the claimed method is the molar ratio of component B and the reagents applied to it. The inventive method allows to choose such conditions of application of the reaction mixture, under which the removal of surplus components of this mixture, i.e. their "autodosing" is achieved. In the particular case of usage the MAI-nI2 reaction mixture (n≥1) in isopropanol, "autodosing" can be achieved by spraying the reaction mixture onto the surface of metallic lead, heated to a temperature of 150-250° C., which leads to evaporation and/or sublimation of surplus components of the reaction mixture.

When using metal films as a layer containing metal, deposition of such films on a substrate is possible by vacuum thermal sputtering, magnetron sputtering, electrodeposition, chemical reduction from solutions or gaseous compounds. When checking the possibility of implementing the proposed method, thin films of metallic lead, tin, Pb—Sn alloys, as well as alloys with alloying additives, for example, Cu and Bi, were tested.

In addition, layer-by-layer deposition of various metals suitable for the formation of a perovskite layer may be used to form a metal-containing layer.

As a specific example of implementation, a film of metallic copper was used as a film of component B, where $MAI:I_2=1:3$ solution was applied at a substrate temperature of 100° C., after which surplus MAI was removed by washing with isopropyl alcohol.

To form a layer containing component B, lead compounds can also be used, for example, $PbI_2$ and PbO, which can be deposited on a substrate by various methods, for example, by applying a solution of lead salts on a rotating substrate.

For the synthesis of $MAPbI_3$, $MAPbI_xBr_{3-x}$, $MA_xFA_{1-x}PbI_3$, a temperature of 120° C. was used. In addition, the method showed the possibility of using at least temperatures from 20 to 150° C. for $MAPbI_3$ and from 20 to 400° C. for $CsPbI_3$. Optimal for the implementation of the method is to maintain the substrate temperature above the melting temperature of the corresponding polyiodide. It is also possible to use a preheated substrate, as well as gradual cooling or gradual heating of the substrate after the application of the reactants. Preheating for 0-10 min was tested.

The substrate can be subjected to further processing after applying a solution to it and completing the reaction to form a perovskite layer. For example, washing with the use of various solvents or a mixture of them, for example, isopropanol, ethanol, diethyl ether, chlorobenzene, toluene, can be used.

Annealing can also be carried out at elevated temperatures. In particular, annealing was tested at 100° C. for 1-10 min, an increase in the annealing time to 60 minutes and longer has not led to a deterioration in the properties of the perovskite layer. In this case, the choice of the temperature of the annealing is determined by the chemical composition of a particular compound and for $MAPbI_3$ usually does not exceed 150° C., for $CsPbI_3$—350° C. Annealing can also be carried out in a special atmosphere, for example, in an atmosphere of humid air, dry air, in an atmosphere of argon, and also in an atmosphere containing solvent vapors, for example, methylamine, dimethylformamide or dimethyl sulfoxide.

Annealing in vapors of the corresponding iodides AX is possible at temperatures limited from below by the evaporation temperature of the corresponding halide, and from above by the temperature of its decomposition. For example, for MAI, the typical temperature range is 150-200° C.

The mixture of reagents and solvent (solution) can be applied to the substrate by the following tested methods: classical spraying through a nozzle, ultrasonic spraying, inkjet printing, spin coating, electrospray, aerosol jet printing, dip coating.

The design of the nozzle for spraying the solution, as well as the mode of spraying, have a direct impact on the amount of substance falling on the substrate per unit of time and the size of the droplets, which affects the uniformity of the coating of the substrate with the solution. The optimal parameters can be chosen experimentally. The geometry of the mutual arrangement of the nozzle and the substrate also affects the quality of the coating and can be chosen experimentally. A distance of 10 cm was tested, and the angle of inclination of the nozzle was 0-15° between the direction of spraying and the normal to the substrate.

Implementation of the method was tested in the following modes: the flow rate of the solution ~0.5 ml/sec; cyclic solution supply for 2 seconds with 10 seconds pauses. Pauses may be necessary to maintain the required temperature of the substrate, to ensure complete and rapid drying of the droplets and to avoid undesirable spreading of the solution over the surface.

The total time of spraying the solution, sprayed with pauses or without pauses, was selected separately for each composition. For $MAPbI_3$, to obtain single-phase films, the range of total deposition times was used from 14 to 18 seconds (7×2 s, 9×2 s). When going beyond the boundaries of the optimal range, films with impurities were formed, which was caused by a substantial surplus or lack of reagents in the solution. Nitrogen and argon were used as carrier gas for spraying. It is also possible to use air and other gases, as well as the use of gases containing special modifying additives.

The invention claimed is:

1. A method for producing a film of a light-absorbing material having a perovskite-like structure and a structural formula of $ABX_3$, the method comprising:
   a) forming a uniform layer of a component B on a substrate, wherein component B is applied per unit area in an amount that provides a given thickness of the final film and the temperature of the component B is 20-400° C.;
   b) applying a mixture of reagents AX, $X_2$ and an inhibitor on the layer of the component B, wherein this mixture does not react with the component B under first predetermined conditions, and AX, $X_2$ reagents are applied in a stoichiometric amount or more than stoichiometric amount with regard to the component B;
   wherein AX and $X_2$ are dissolved in organic solvent;
   c) forming liquid reactive polyhalide melts having general composition structure $AX_n$ (n≥2.5) by removing the inhibitor, and uniformly distributing said formed melts over the layer of the component B, followed by a reaction between the component B and the reactive polyhalide melts under second predetermined conditions;
   wherein $AX_n$ has a melting temperature, and the substrate is maintained at a temperature above a melting temperature of $AX_n$; and
   wherein the reaction of the melts $AX_n$ with the component B produces the highly homogeneous large area film of a perovskite-like material having the structural formula of $ABX_3$, wherein
   $CH_3NH_3^+(MA^+)$, $(NH_2)_2CH^+(FA^+)$, $Cs^+$, $Rb^+$, or a mixture thereof is used as component A;
   $Cl^-$ or $Br^-$ or $I^-$ or a mixture thereof is used as component X, and
   Pb, Sn or a mixture thereof is used as the component B.

2. The method according to claim 1, wherein the inhibitor is removed under conditions that differ from the first predetermined conditions.

3. The method according to claim 1, wherein the inhibitor is removed from the mixture by evaporation or freezing or sublimation.

4. The method according to claim 1, wherein a solvent is used as an inhibitor to dissolve at least one of the reagents in the solvent.

5. The method according to claim 1, wherein the inhibitor uses a liquid that is not miscible with at least one of the reagents.

6. The method according to claim 1, wherein the inhibitor is removed by washing the substrate with a solvent, in which insoluble components of the film of the perovskite-like material are not soluble.

7. The method according to claim 1, wherein to obtain the film of a perovskite-like light-absorbing material having a structural formula $ABX_3$, the mixture of reagents AX and $X_2$ is applied to the substrate in a solution of the inhibitor, wherein the inhibitor is an organic solvent that slows down a reaction of AX and $X_2$ with the reagent B, and said organic solvent is further removed to ensure the following reaction occurs:

$$B+AX+X_2=ABX_3.$$

8. The method according to claim 7, wherein the reagents AX and $X_2$ are dissolved in the organic solvent, but component B is not dissolved in the organic solvent.

9. The method according to claim 7, wherein the component B is applied on the substrate in an amount per unit area that provides a final film of the perovskite-like compound $ABX_3$ of a given thickness.

10. The method according to claim 1, wherein the component B is applied by a vacuum deposition or electrochemical deposition or by contacting a wave of the melted component B with a cooled substrate or by chemical vapor deposition from gas phase.

11. The method according to claim 1, wherein the mixture is applied by spraying through a nozzle, or ultrasonic spraying, or inkjet printing, or spin coating, or electrospraying, or printing, or dip coating.

12. The method according to claim 7, wherein surplus of reagents AX and $X_2$ after completion of the reaction is removed by washing with a solvent that does not interact with the film of the perovskite-like material.

13. The method according to claim 7, wherein surplus of reagents AX and $X_2$, after completion of the reaction, is removed by dropping a solvent that does not interact with the film of the perovskite-like material on the substrate.

14. The method according to claim 7, wherein surplus of reagents AX and $X_2$, after completion of the reaction, is removed by calcination at an elevated temperature.

15. The method according to claim 7, wherein surplus of reagents AX and $X_2$, after completion of the reaction, is removed by evaporation under reduced pressure.

16. The method according to claim 10, wherein deposition is carried out using a carrier gas, which is dry air or argon or nitrogen.

17. The method according to claim 1, wherein isopropyl alcohol or ethyl alcohol is used as the inhibitor.

18. The method according to claim 12, wherein a prepared mixture is applied under conditions that remove surplus components that are not involved in the reaction.

19. The method according to claim 7, further comprising introducing into the solution one or more other halides that do not form the perovskite-like structure.

20. The method according to claim 7, wherein the inhibitor comprises isopropyl alcohol, and wherein temperature of the substrate and/or selection of an initial amount of isopropyl alcohol in the inhibitor at least partially compensates for the reaction starting before complete evaporation of the isopropyl alcohol.

* * * * *